(12) United States Patent  
Choi (10) Patent No.: US 7,411,572 B2  
(45) Date of Patent: Aug. 12, 2008

(54) ORGANIC ELECTROLUMINESCENCE DISPLAY

(75) Inventor: Woong-Sik Choi, Suwon-si (KR)

(73) Assignee: Samsung SDI Co., Ltd. (KR)

( * ) Notice: Subject to any disclaimer, the term of this patent is extended or adjusted under 35 U.S.C. 154(b) by 417 days.

(21) Appl. No.: 11/273,052

(22) Filed: Nov. 14, 2005

(65) Prior Publication Data

US 2006/0103640 A1    May 18, 2006

(30) Foreign Application Priority Data

Nov. 17, 2004    (KR)  .................... 10-2004-0094313

(51) Int. Cl.
*G09G 3/30* (2006.01)
*H01L 27/14* (2006.01)

(52) U.S. Cl. ............... 345/80; 257/40; 257/72; 438/161

(58) Field of Classification Search ............ 345/76, 345/77, 80, 82; 257/40, 72; 438/149, 161
See application file for complete search history.

(56) References Cited

U.S. PATENT DOCUMENTS

| 5,953,597 | A  | * | 9/1999  | Kusumoto et al. | ......... 438/161 |
| 7,005,677 | B2 | * | 2/2006  | Park et al.     | ............. 257/72 |
| 7,061,017 | B2 | * | 6/2006  | Ogata et al.    | ............. 257/66 |
| 7,224,334 | B2 | * | 5/2007  | Choi et al.     | ............. 345/82 |
| 7,304,639 | B2 | * | 12/2007 | Park et al.     | ........... 345/206 |

* cited by examiner

*Primary Examiner*—Thuy Vinh Tran
(74) *Attorney, Agent, or Firm*—Knobbe, Martens, Olson & Bear LLP (57) ABSTRACT

Embodiments of an organic electroluminescence display capable of preventing line mura generated due to manufacturing differences in driving transistors are disclosed. The manufacturing differences may be due to deviations of irradiated energy beam density generated from an excimer laser annealing process for crystallizing amorphous silicon into polycrystalline silicon. One embodiment of an organic electroluminescence display a plurality of pixel circuits arranged perpendicular to a laser scan direction for crystallization. Each pixel circuit comprises an organic light-emitting diode, and a driving transistor configured to supply current to the organic light-emitting diode. Each driving transistor comprises at least two channels formed therein, wherein the sums of lengths of the at least two channels in each driving transistor of the display are equal.

18 Claims, 6 Drawing Sheets

ELA SCANNING DIRECTION

ORGANIC ELECTROLUMINESCENCE DISPLAY

CROSS-REFERENCE TO RELATED APPLICATION

This application claims the benefit of Korean Patent Application No. 10-2004-94313, filed on Nov. 17, 2004, the disclosure of which is hereby incorporated herein by reference in its entirety.

BACKGROUND OF THE INVENTION

1. Field of the Invention

The present invention relates to a light-emitting display, and more particularly, to an organic electroluminescence display configured to prevent line mura generated due to differences in driving transistor characteristics resulting from non-uniformities due to excimer laser annealing.

2. Description of Related Technology

Various flat panel displays have been developed which overcome the large weight and volume which are drawbacks of cathode ray tube displays. Types of flat panel displays include a liquid crystal display, a field emission display, a plasma display panel, and an organic electroluminescence display.

The organic electroluminescence display uses a self-light emitting device for emitting light by recombination of electrons and holes. The organic electroluminescence display has a fast response speed and low power consumption.

Figure 1:
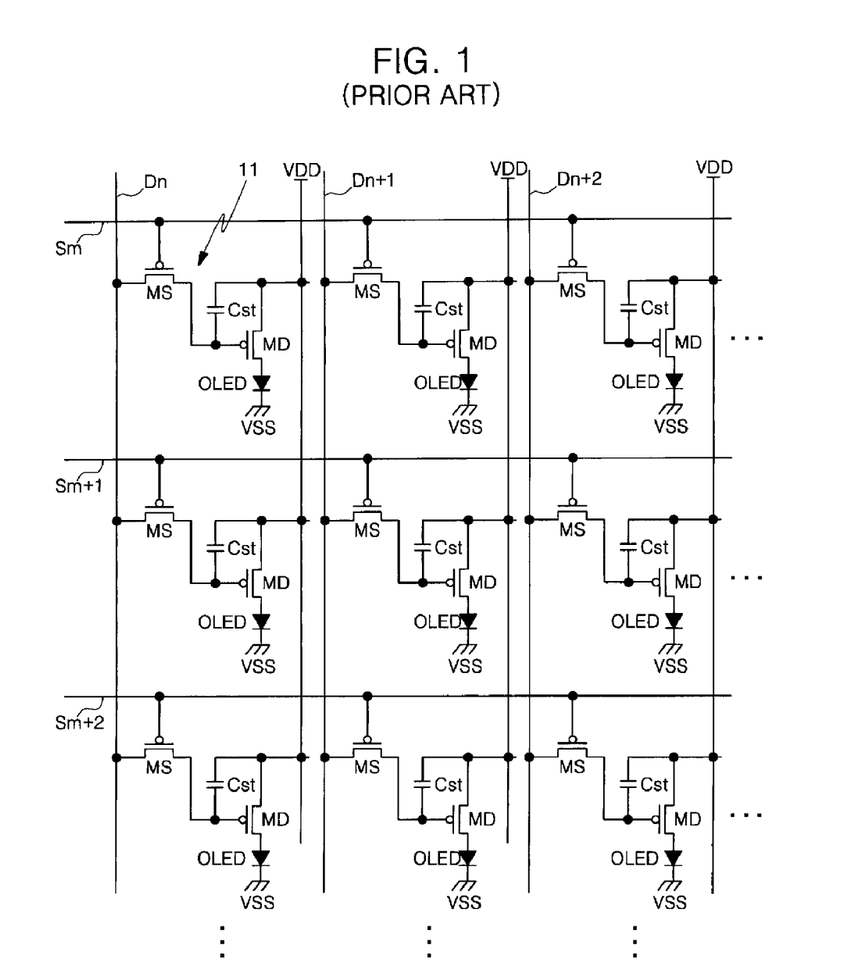
FIG. 1 is a schematic diagram of plurality of pixels in an exemplary organic electroluminescence display.
Figure 2:
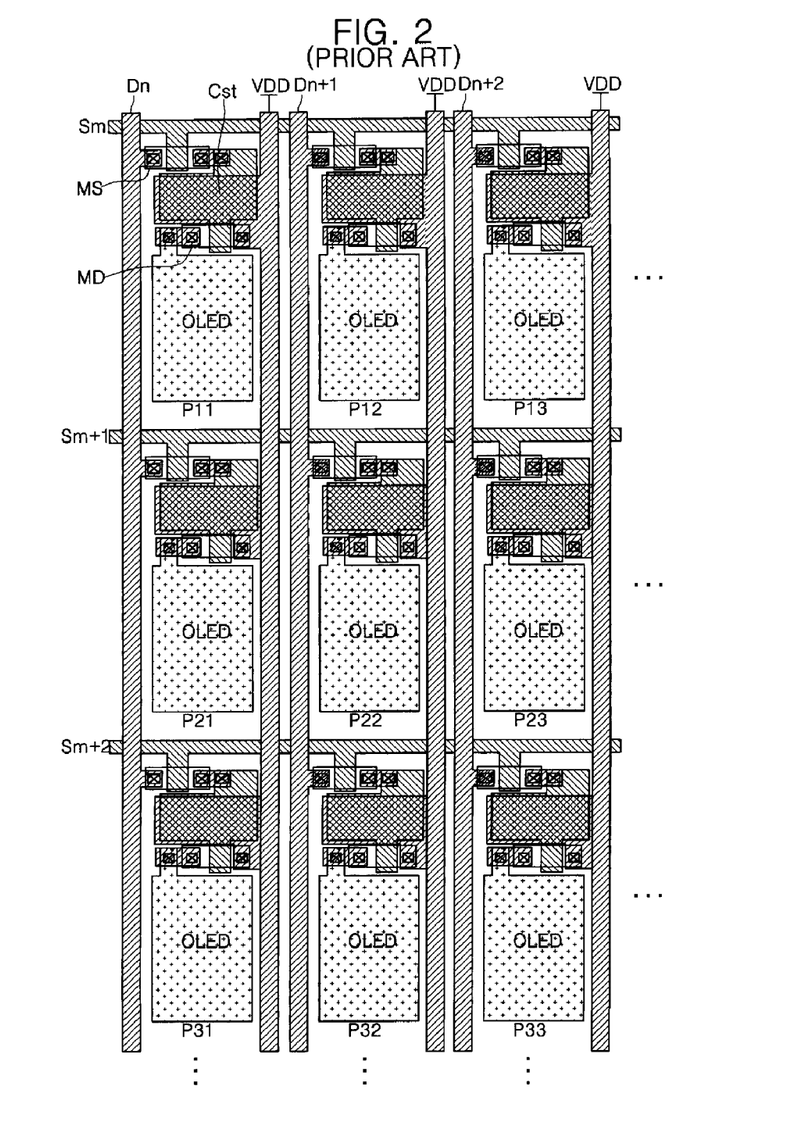
FIG. 2 is an illustration of an exemplary layout for the pixel circuits of FIG. 1.

FIG. 1 is a schematic diagram of a plurality of pixels in an exemplary organic electroluminescence display, and FIG. 2 is an illustration of the layout of the organic electroluminescence display of FIG. 1.

Referring to FIG. 1 and FIG. 2, the exemplary organic electroluminescence display comprises a plurality of pixel circuits 11 surrounded by a plurality of scanning lines S1 to Sm, a plurality of data lines D1 to Dn, and a first power supply line VDD. The scanning lines Sm are formed in a row direction, and the data lines Dn and the first power supply line VDD are formed in a column direction.

Each pixel circuit 11 comprises an organic light-emitting diode (OLED), a driving transistor MD, a capacitor Cst and a switching transistor MS, wherein the transistors MD and MS are MOSFETs (metal-oxide semiconductor field effect transistors). Each pixel circuit 11 receives a data signal from the data line Dn when a selection signal is supplied to the scanning line Sm, and the pixel emits light in response to the received data signal.

A first electrode of the OLED, e.g., an anode electrode, is connected to the driving transistor, and a second electrode, e.g., a cathode electrode is connected to a second power supply line VSS. The OLED comprises an emitting layer, an electron transport layer, and a hole transport layer, formed between the anode electrode and the cathode electrode. The OLED further comprises an electron injection layer and a hole injection layer. When a voltage is applied between the anode electrode and the cathode electrode of the OLED, electrons generated from the cathode electrode move to the emitting layer via the electron injection layer and the electron transport layer, and electrons generated from the anode electrode move to the emitting layer via the hole injection layer and the hole transport layer. Thereby, electrons from the electron transport layer and holes from the hole transport layer are recombined in the emitting layer to emit light.

In operation, the switching transistor MS is turned on in response to a selection signal supplied to the scanning line Sm, and the switching transistor MS supplies a data signal from the data line Dn to a gate electrode of the driving transistor MD. The storage capacitor Cst stores a voltage difference between a driving voltage supplied to the first power supply line VDD and a data signal supplied to the gate electrode of the driving transistor MS.

The driving transistor MD controls the light emission from the OLED in response to the data signal supplied to the gate electrode of the driving transistor MD, thereby controlling a current level supplied to the OLED from the first power supply line VDD. When the switching transistor MS is turned off, the driving transistor MD supplies a constant current to the OLED with voltage stored in the storage capacitor Cst until a data signal of a next video frame is supplied to the data line Dn. Thereby, the driving transistor controls emission of the OLED.

As described above, the driving transistor MD of the respective pixel circuits 11 plays an important role in controlling the light emission from the OLED. The light emission of the OLED is controlled by the driving transistor MD by controlling the amount of current supplied to the OLED according to voltage supplied to the gate electrode of the driving transistor MD itself. Thus, a current Ids supplied to the OLED through the driving transistor MD is determined by the following equation (1), where W and L are the width and length of channels in the driving transistor MD, Vgs is the voltage applied across the gate and source terminals of the driving transistor MD, Vth is the threshold voltage of the driving transistor, $\mu$ is mobility, and Cox is gate capacity per unit area of the driving transistor MD:

$$Ids=(1/2) \times (W/L) \times \mu Cox(Vgs-Vth)^2 \qquad (1)$$

Referring to equation (1), the current Ids supplied through the driving transistor MD is determined by data voltage supplied to the gate electrode of the driving transistor MD, and characteristics of the data voltage depend on the threshold voltage Vth and mobility. The driving transistor MD, however, may have non-uniform characteristics, such as threshold voltage and mobility, as a result of a laser annealing process comprising crystallizing amorphous silicon into polycrystalline silicon. In a process for fabricating an organic electroluminescence display, a process of forming a semiconductor layer for the pixel circuit transistors MD and MS includes a laser annealing process comprising crystallizing amorphous-silicon thin film into a poly-silicon thin film.

Figure 3:
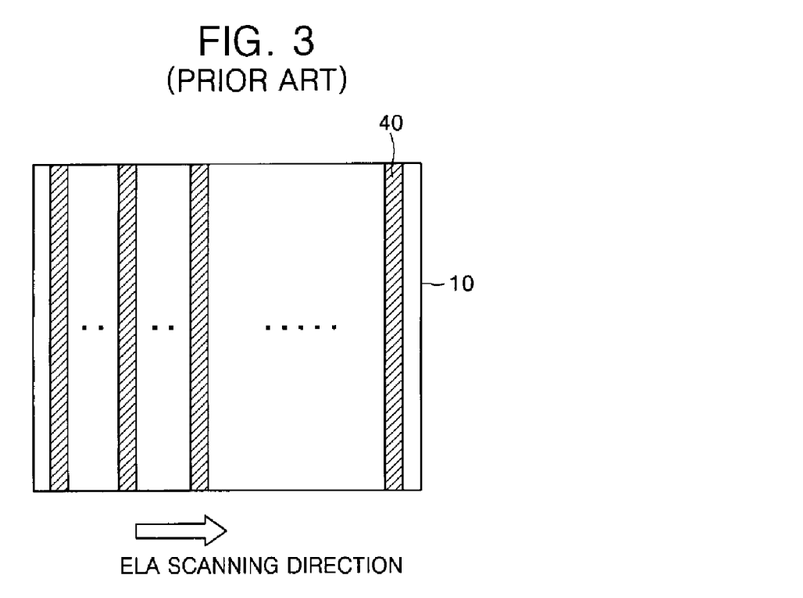
FIG. 3 is an illustration of a laser annealing method for crystallizing a semiconductor layer of transistors.
Figure 4:
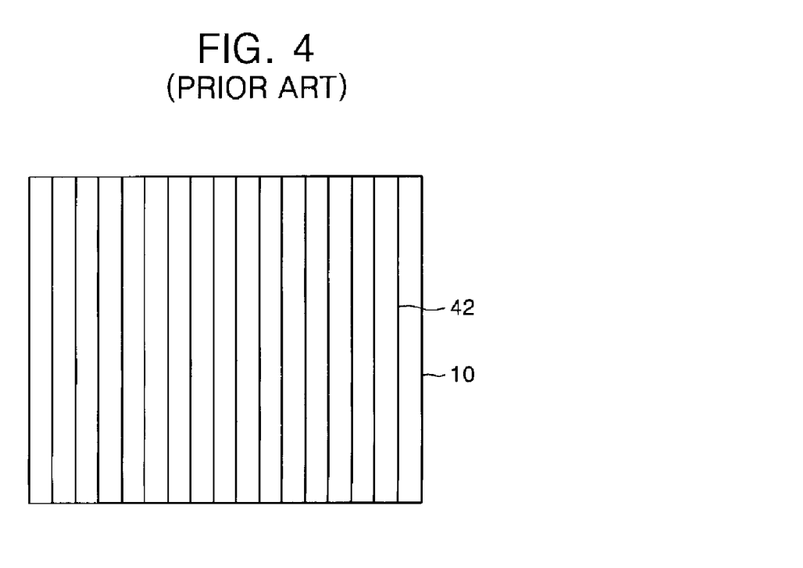
FIG. 4 is an illustration of a line mura generated in an organic electroluminescence display.

FIG. 3 is an illustration of a laser annealing method for crystallizing a semiconductor layer for the transistors of FIG. 2, and FIG. 4 is an illustration of a line mura generated in a conventional organic electroluminescence display. The line mura denotes non-uniformity of displayed image. Referring to FIG. 3, a poly-silicon thin film is formed by crystallizing an amorphous-silicon thin film patterned on a substrate 10. The amorphous-silicon thin film is crystallized by an excimer laser annealing process (labeled "ELA"), comprising scanning a line beam 40 using an excimer laser in a row direction. The poly-silicon thin film is formed by repeatedly melting and solidifying the amorphous-silicon thin film by a very short laser beam that is irradiated at high energy, thereby recrystallizing the amorphous-silicon thin film.

Although the laser annealing process provides for formation of a poly-silicon thin film on a wide substrate, grain size and mobility are varied according to deviation of beam energy density generated per laser irradiation time points. Accordingly, characteristics of the poly-silicon thin film become non-uniform along a column direction perpendicular to a laser scan direction. Thus, when the poly-silicon thin film is used as the semiconductor layer of the driving transistor MD, transistor characteristics such as threshold voltage and mobility are non-uniform in a column direction. These transistor non-uniformities may result in luminance deviation in a column direction relative to the same luminance. As a result, a line mura 42 is generated perpendicular to a laser scan direction, as illustrated in FIG. 4, due to non-uniform characteristics of the driving transistors MD of the display pixels. The line mura 42 reduces image quality due to high visibility, and reduces yield of an organic electroluminescence display.

SUMMARY OF CERTAIN INVENTIVE EMBODIMENTS

Therefore, in order to solve the foregoing problems of the prior art, embodiments of an organic electroluminescence display capable of preventing formation of line mura due to excimer laser annealing and improving image quality are disclosed. Line mura is prevented by randomly forming a plurality of channels on driving transistors arranged perpendicular to a laser scan direction for crystallization.

One embodiment of an organic electroluminescence display comprises a plurality of pixel circuits arranged in rows and columns on a region of a display panel where data lines and scanning lines cross each other. Each pixel circuit is arranged perpendicular to a laser scan direction for crystallization and comprises an organic light-emitting diode and a driving transistor. The driving transistor is configured to supply current to the organic light emitting diode, wherein the supplied current corresponds to data signals supplied through the data lines. Each driving transistor comprises at least two channels formed therein, wherein the sums of the lengths of the at least two channels in each driving transistor are equal. In certain embodiments, the widths of the at least two channels in each driving transistor are equal.

One embodiment of a device comprises a plurality of driving transistors arranged perpendicular to a laser scan direction for crystallization. Each driving transistor comprises a semiconductor layer formed on a substrate and comprising a source region, a drain region, and at least two channels. Each driving transistor further comprises a gate insulation film formed on the semiconductor layer, at least two gate electrodes formed on the gate insulation film at positions corresponding to the at least two channels, an interlayer insulation film formed on the at least two gate electrodes, and source and drain electrodes in contact with the source and drain regions of the semiconductor layer. The sums of the lengths of the at least two channels in each driving transistor are equal. In certain embodiments, the widths of the at least two channels in each driving transistor are equal.

DETAILED DESCRIPTION OF CERTAIN INVENTIVE EMBODIMENTS

The following detailed description is directed to certain specific embodiments of the invention. However, the invention can be embodied in a multitude of different ways as defined and covered by the claims. In this description, reference is made to the drawings wherein like parts are designated with like numerals throughout.

Figure 5:
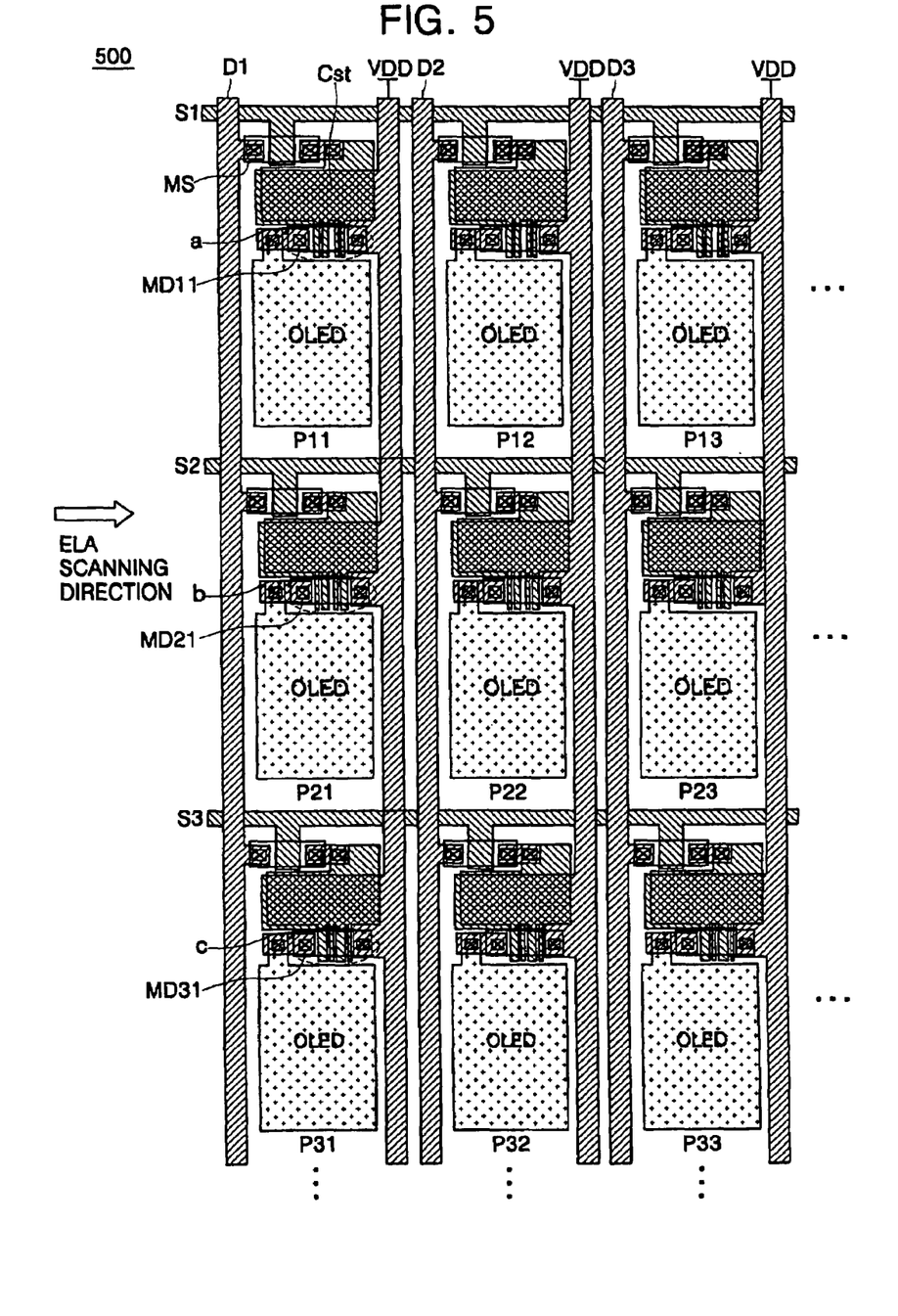
FIG. 5 is a layout diagram illustrating one embodiment of an organic electroluminescence display.

FIG. 5 is a layout drawing illustrating one embodiment of an organic electroluminescence display 500. As illustrated in FIG. 5, the organic electroluminescence display 500 comprises a plurality of pixels P11-Pmn positioned on a cross region of a plurality of data lines D1-Dn and a plurality of scanning lines S1-Sm. The organic electroluminescence display 500 further comprises a plurality of pixel circuits P11-P13, P21-P23 and P31-P33 positioned on a region of the display 500 where a plurality of data lines D1-D3 and a plurality of scanning lines S1-S3 cross each other.

Each of the plurality of pixel circuits P11-P13, P21-P23 and P31-P33 comprises an organic light-emitting diode (OLED) configured to emit light, a switching transistor MS, and a capacitor Cst. A scanning line Sm is connected to a gate electrode of the switching transistor MS, a data line Dn is connected to a source electrode, and a first, lower electrode of the capacitor Cst is connected to a drain electrode. The switching transistor MS is turned on when a selection signal is supplied to the switching transistor MS from the scanning line Sm, and a data signal supplied from the data line Dn is supplied to the capacitor Cst.

The capacitor Cst comprises a second electrode, e.g., an upper electrode, that is connected to a power supply voltage line VDD, and a first electrode, e.g., a lower electrode, that is connected to a drain electrode of the switching transistor MS. The capacitor Cst is configured to store a voltage corresponding to a data signal applied to the data line Dn while the switching transistor MS is turned on, and further configured to maintain the stored voltage while the switching transistor MS is turned off.

Each driving transistor MD11, MD21, MD31, . . . MDn1 has at least two channels for driving the first column of pixel circuits P11, P21, P31, . . . , Pn1, wherein the channels are arranged perpendicular to an excimer laser annealing (ELA) scanning direction for crystallization. In addition, each driving transistor MD1$m$, MD2$m$, MD3$m$, . . . MDnm also has at least two channels for driving pixel circuits P1$m$, P2$m$, P3$m$, . . . , Pnm in the second column through the m column of pixels, wherein the channels are arranged in a scanning direction for excimer laser annealing. Although the excimer laser annealing scanning direction as illustrated in FIG. 5 is a row direction, the scanning direction is not limited thereto, wherein excimer laser annealing may proceed in a column direction. Furthermore, the display 500 further comprises at least two channels randomly formed on each of the driving transistors.

Figure 6A:
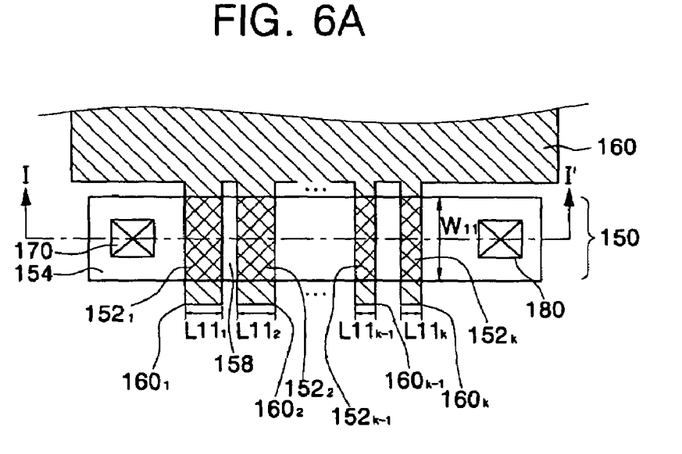
FIGS. 6A-C are close-up illustrations of areas A, B, and C of FIG. 5, including the driving transistors of the first column of pixels.
Figure 6B:
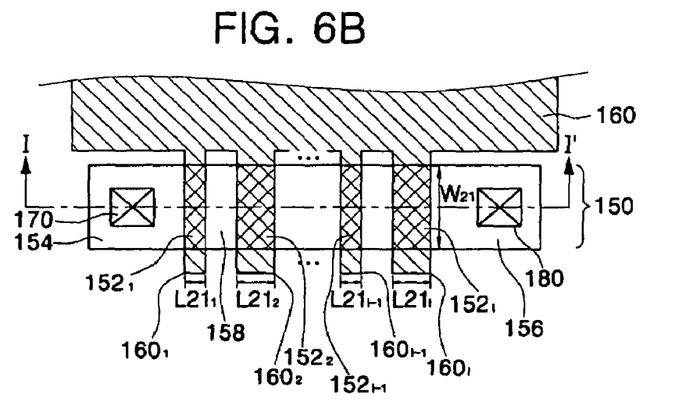
Figure 6C:
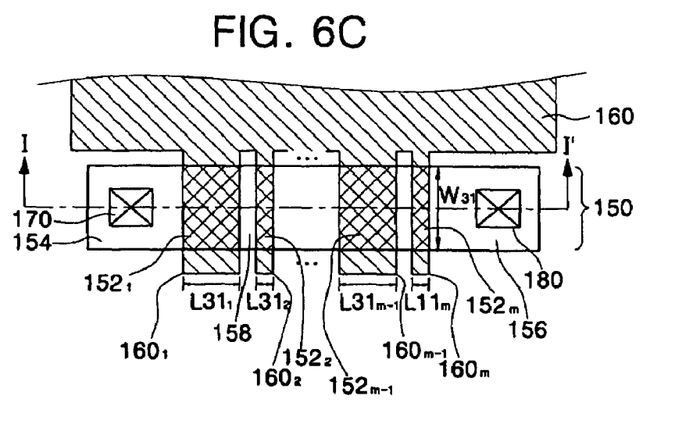

FIGS. 6A-C are partial layout illustrations showing close-up views of areas A, B, and C of FIG. 5, wherein FIGS. 6A-C illustrate the driving transistors MD11, MD21, MD31 in the first column, first through third rows of the organic electroluminescence display of FIG. 5. Referring to FIGS. 6A-C, each driving transistor MD11, MD21 and MD31 comprises a semiconductor layer 150 having source/drain regions 154, 156, at least two channels 152, at least two gate electrodes $160_1, 160_2, \ldots, 160_{k-1}, 160_k$, and source/drain electrodes 170, 180.

Referring to FIG. 6A, the driving transistor MD11 comprises a gate insulation film, such as $SiO_2$ (not shown), formed on the semiconductor layer 150, and the at least two gate electrodes $160_1, 160_2, \ldots 160_{k-1}, 160_k$ formed on the gate insulation, wherein the gate electrodes are spaced apart from one another. One end of each of the at least two gate electrodes $160_1, 160_2, \ldots 160_{k-1}, 160_k$ is connected to an end of the other gate electrodes to form a lower electrode 160 of the capacitor Cst (FIG. 5). The source/drain regions 154, 156 are formed in the semiconductor layer 150 by ion doping, wherein the at least two gate electrodes $160_1, 160_2, \ldots, 160_{k-1}, 160_k$ are already formed on the semiconductor layer 150. Accordingly, the at least two channels $152_1, 152_2, \ldots 152_{k-1}, 152_k$ corresponding to the at least two gate electrodes $160_1, 160_2, \ldots 160_{k-1}, 160_k$ are formed on the semiconductor layer 150. In one embodiment, the position and area of the at least two channels $152_1, 152_2, \ldots 152_{k-1}, 152_k$ are determined by randomly forming the at least two channels $152_1, 152_2, \ldots 152_{k-1}, 152_k$ on the semiconductor layer 150. Furthermore, at least one ion doped region 158 is formed between the at least two channels $152_1, 152_2, \ldots 152_{k-1}, 152_k$, wherein k is an integer of 2 or more.

Similar to the driving transistor MD11, the driving transistor MD21 comprises at least two channels $152_1, 152_2, \ldots 152_{l-1}, 152_l$ randomly formed on the semiconductor layer 150, wherein l is an integer of 2 or more. Furthermore, the driving transistor MD31 comprises at least two channels $152_1, 152_2, \ldots 152_{m-1}, 152_m$ randomly formed on the semiconductor layer 150 as in the driving transistor MD11, wherein m is an integer of 2 or more.

Thus, although defects are formed on a specific part of the semiconductor layer by an energy beam density deviation during an excimer laser annealing process, at least two channels are randomly formed on each of the driving transistors, without a fixed pattern and perpendicular to the laser scan direction, to prevent formation of line mura.

Each of the at least two channels $152_1, 152_2, \ldots 152_{k-1}, 152_k, 152_1, 152_2, \ldots 152_{l-1}, 152_l$ and $152_1, 152_2, \ldots 152_{m-1}, 152_m$ of the respective driving transistors MD11, MD21, MD31 has a length L and a width W. In reference to FIGS. 6A-C, the at least two channels $152_1, 152_2, \ldots 152_{k-1}, 152_k$ of the driving transistor MD11 have lengths $L11_1, L11_2, \ldots L11_{k-1}, L11_k$ and width W11; the at least two channels $152_1, 152_2, \ldots 152_{l-1}, 152_l$ of the driving transistor MD21 have lengths $L21_1, L21_2, \ldots L21_{l-1}, L21_l$ and width W21; and the at least two channels $152_1, 152_2, \ldots 152_{k-1}, 152_k$ of the driving transistor MD31 have lengths $L31_1, L31_2, \ldots L31_{m-1}, L31_m$ and width W31.

In one embodiment, the sum of the lengths of the at least two channels of the driving transistor MD11, the sum of the lengths of the at least two channels of the driving transistor MD21, and the sum of the lengths of the at least two channels of the driving transistor MD31 are equal to one another. This relationship is represented mathematically as follows:

$$\Sigma L11_1 + L11_2 + \ldots L11_{k-1} + L11_k = \Sigma L21_1 + L21_2 + \ldots L21_{k-1} + L21_k = \Sigma L31_1 + L31_2 + \ldots L31_{k-1} + L31_k \quad (2)$$

In certain embodiments, the widths of the at least two channels of the respective driving transistors MD11, MD21, MD31 are equal to one another (W11=W21=W31).

In one embodiment, the sum of the lengths of the at least two channels that are provided in each pixel circuit are equal to each pixel circuit and the sum of the widths of the at least two channels that are provided in each pixel circuit are equal to each pixel circuit. This relationship maintains an equal current that flow to the organic light emitting diode relative to the same data voltage per each pixel as represented in the above equation (1). Although the foregoing description is directed to driving transistors in the first column and first through third rows of an organic electroluminescence display, the description similarly applies to the additional rows of pixels in the first row, and the remaining columns of pixels in the organic electroluminescence display.

As described above, image quality is improved by preventing the formation of line mura due to excimer laser annealing. Where the line mura results from non-uniformities of the driving transistors in a direction perpendicular to the scanning direction of excimer laser annealing, image quality is improved by forming at least two channels at the driving transistors, wherein the channels are randomly formed and arranged perpendicular to the laser scan direction. In one embodiment, the sum of the lengths of the at least two channels of respective driving transistors is equal to the sum of the widths of the at least two channels of respective driving transistors.

Figure 7A:
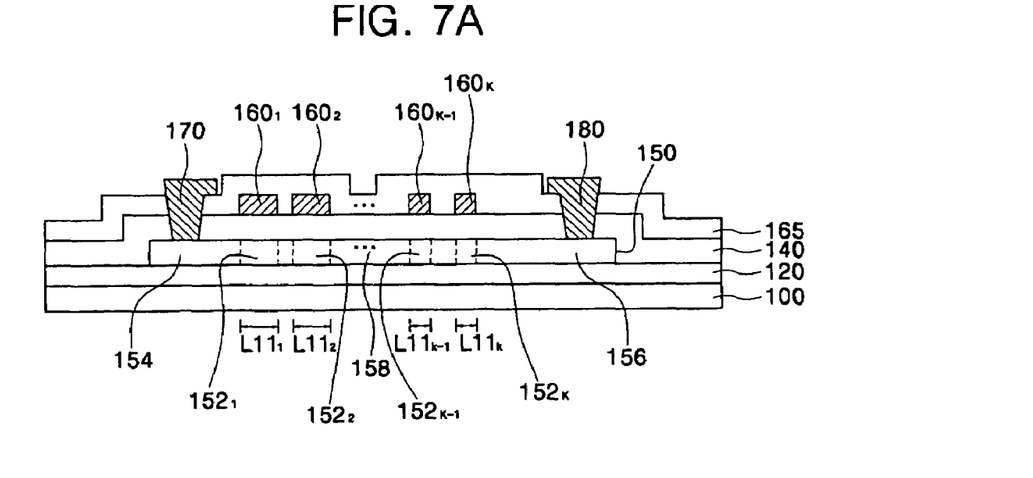
FIGS. 7A-C are cross sectional views taken along line I-I' of the respective driving transistors illustrated in FIGS. 6A-C.
Figure 7B:
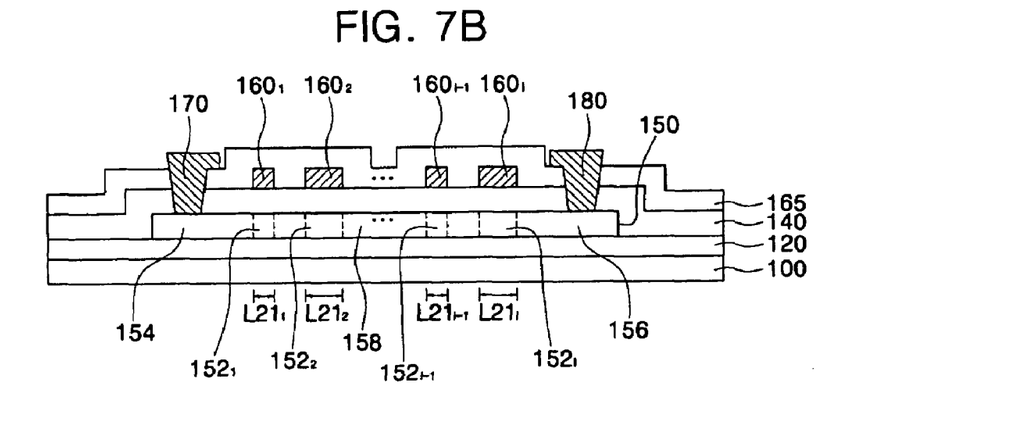
Figure 7C:
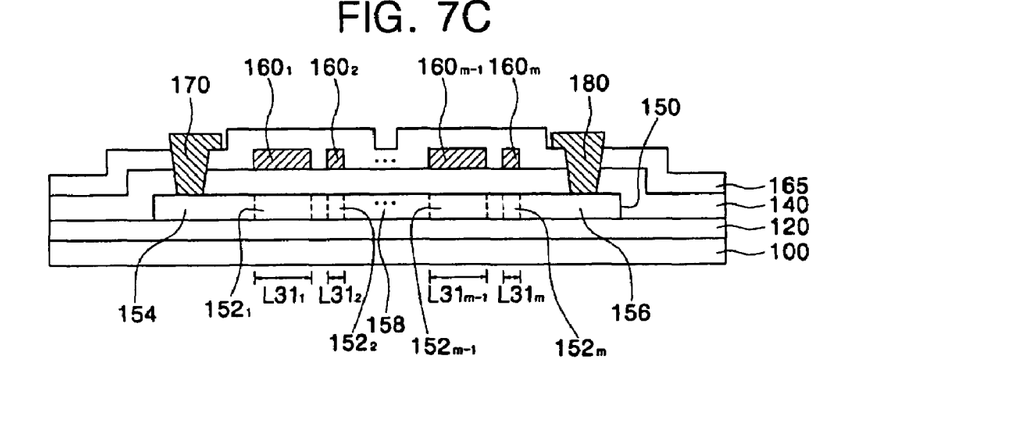

FIGS. 7A-C are cross-sectional views of driving transistors taken along line I-I' of FIGS. 6A-C, respectively. Referring to FIG. 7A, the driving transistor MD11 comprises a buffer layer 120 formed on a substrate 100, and the semiconductor layer 150 is formed on the buffer layer 120. In one embodiment, the semiconductor layer 150 has a predefined pattern. In one embodiment, the semiconductor layer 150 comprises polycrystalline silicon formed by heat treating amorphous silicon, wherein the amorphous silicon is crystallized into polycrystalline silicon by a laser annealing process. In certain embodiments, the laser annealing process comprises scanning a line beam using an excimer laser.

A gate insulation film 140 is formed on the buffer layer 120 and the semiconductor layer 150. In one embodiment, the gate insulation film 140 comprises an insulating material, such as $SiO_2$. After formation of the gate insulation film 140, the at least two gate electrodes $160_1, 160_2, \ldots 160_{k-1}, 160_k$ are randomly formed on the gate insulation film 140 in an area corresponding to the semiconductor layer 150. The at least two gate electrodes $160_1, 160_2, \ldots 160_{k-1}, 160_k$ comprise one or more conductive materials, such as Al, MoW, Al/Cu, and the electrodes are spaced apart from each other. Ends of the at least two gate electrodes $160_1, 160_2, \ldots 160_{k-1}, 160_k$ are connected to one another to form a lower electrode of a capacitor (not shown).

Following formation of the gate electrodes 160, the substrate 100 is ion doped between the source region 154 and the drain region 156 of the semiconductor layer 150, and the at least two gate electrodes $160_1, 160_2, \ldots 160_{k-1}, 160_k$. Thereby, the at least two channels $152_1, 152_2, \ldots 152_{k-1}, 152_k$ are formed between the source region 154 and the drain region 156 of the semiconductor layer 150.

An interlayer insulator 165 is formed on the at least two gate electrodes $160_1, 160_2, \ldots 160_{k-1}, 160_k$, and contact holes are formed in the interlayer insulator 165 and the gate insulation film 140 so as to expose the source/drain regions 154, 156. After forming the contact holes 166, 167, a source electrode 170 and a drain electrode 180 are formed of a metallic material in predefined patterns on the interlayer insulator 165, wherein the source electrode 170 and the drain electrode 180 are electrically connected to the source region 154 and the drain region 156 of the semiconductor layer 150 through the contact holes.

As discussed above, at least two gate electrodes and at least two channels are randomly formed on the driving transistor MD21 and the driving transistor MD31 similar to the driving transistor MD11. In one embodiment, the sum of the lengths of the at least two channels of the driving transistors MD11, MD21, MD31 are equal to each pixel circuit and the sum of the widths of the at least two channels of the driving transistors are equal to each pixel circuit. Thereby, line mura formed perpendicular to a scanning direction of an excimer laser is randomly formed due to the random formation of the channels in the driving transistors. Thus, the contiguous line mura which form a striped pattern on a conventional display do not appear.

Thus, the image quality of an organic electroluminescence display is improved by randomly forming at least two channels in the driving transistors of the display pixel circuits, wherein the channels are arranged perpendicular to a scanning direction of the excimer laser used to form the driving transistors. In one embodiment, the sum of the lengths of the at least two channels is equal to the sum of the widths of the at least two channels, thereby preventing the formation of line mura along the irradiation direction of the excimer laser.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. An organic electroluminescence display, comprising:
    a plurality of pixel circuits arranged in rows and columns on a region of a display panel where a plurality of data lines and a plurality of scan lines cross each other,
    wherein each pixel circuit is arranged perpendicular to a laser scan direction for crystallization, and wherein each pixel circuit comprises:
        an organic light-emitting diode configured to emit light, and
        at least one driving transistor configured to supply current to the organic light-emitting diode, wherein the supplied current corresponds to data signals supplied through the data lines, wherein each driving transistor comprises at least two channels formed therein, and wherein the sums of the lengths of the at least two channels in each driving transistor are equal.

2. The organic electroluminescence display according to claim 1, wherein the widths of the at least two channels in each driving transistor are equal.

3. The organic electroluminescence display according to claim 1, wherein each driving transistor further comprises an ion doped region between the at least two channels.

4. The organic electroluminescence display according to claim 1, wherein the crystallization comprises formation of a polycrystalline silicon layer from an amorphous silicon layer.

5. The organic electroluminescence display according to claim 4, wherein the crystallization is performed by an excimer laser annealing process.

6. The organic electroluminescence display according to claim 1, wherein each driving transistor further comprises a source electrode and a drain electrode in contact with a source region and a drain region, respectively, an insulation layer, and at least two gate electrodes formed such that the insulation layer is between the at least two gate electrodes and the at least two channels.

7. The organic electroluminescence display according to claim 6, wherein each pixel circuit further comprises a switching transistor configured to supply data signals from the data lines to the at least two gate electrodes of the driving transistors according to selection signals supplied to the scanning lines, and a capacitor configured to store a voltage corresponding to a difference between a voltage at the at least two gate electrodes and the source or drain electrode of the driving transistor.

8. The organic electroluminescence display according to claim 6, wherein at least one side of the gate electrodes are connected to each other.

9. A device comprising a plurality of driving transistors arranged perpendicular to a laser scan direction for crystallization, each driving transistor comprising:
    a semiconductor layer formed on a substrate and comprising a source region, a drain region, and at least two channels;
    a gate insulation film formed on the semiconductor layer;
    at least two gate electrodes formed on the gate insulation film at positions corresponding to the at least two channels;
    an interlayer insulation film formed on the at least two gate electrodes; and
    a source electrode and a drain electrode in contact with the source and drain regions, wherein the sums of the lengths of the at least two channels in each driving transistor are equal.

10. The device according to claim 9, wherein widths of the at least two channels of the driving transistors are equal.

11. The device according to claim 9, wherein each driving transistor comprises an ion doped region located between the at least two channels.

12. The device according to claim 9, wherein the crystallization forms a polycrystalline silicon layer from an amorphous silicon layer.

13. The device according to claim 12, wherein the crystallization is performed by an excimer laser annealing process.

14. The device according to claim 9, wherein a side of each of the at least two gate electrodes are connected to each other.

15. A method of manufacturing a device comprising a plurality of driving transistors arranged perpendicular to a laser scan direction for crystallization, the method comprising:
    forming a semiconductor layer on a substrate, wherein the semiconductor layer comprises a source region, a drain region;
    forming a gate insulation film on the semiconductor layer;
    forming at least two gate electrodes on the gate insulation film; and
    forming at least two channels in the semiconductor layer at positions corresponding to the at least two gate electrodes, wherein the sums of the lengths of the at least two channels in each driving transistor are equal.

16. The method according to claim 15, further comprising ion doping a region between the at least two channels.

17. The method according to claim 15, wherein the crystallization comprises transforming an amorphous silicon layer into a polycrystalline silicon layer.

18. The method according to claim 15, wherein the crystallization comprises an excimer laser annealing process.

* * * * *